United States Patent [19]

Low et al.

[11] Patent Number: 4,853,647
[45] Date of Patent: Aug. 1, 1989

[54] CURRENT GAIN COMPENSATION ARRANGEMENT

[75] Inventors: Michael L. Low, Old Bridge; Jack Craft, Bridgewater, both of N.J.

[73] Assignee: RCA Licensing Corp., Princeton, N.J.

[21] Appl. No.: 188,996

[22] Filed: May 2, 1988

[51] Int. Cl.$^4$ ............................................. H03F 3/45
[52] U.S. Cl. .................................... 330/256; 330/257; 330/261; 358/190
[58] Field of Search ....................... 330/256, 257, 261; 323/315, 316; 358/184, 190

[56] References Cited

U.S. PATENT DOCUMENTS

| | | | |
|---|---|---|---|
| 3,668,541 | 6/1972 | Pease | 330/289 |
| 3,878,471 | 4/1975 | Ahmed | 330/296 |
| 3,891,935 | 6/1975 | Limberg | 330/253 |
| 3,938,054 | 2/1976 | Leidich | 330/256 |
| 4,714,871 | 12/1987 | Craft et al. | 323/315 |

FOREIGN PATENT DOCUMENTS 0096416  6/1983  Japan .................................... 330/257

Primary Examiner—James B. Mullins
Attorney, Agent, or Firm—E. M. Whitacre; J. J. Laks; S. S. Henig

[57] ABSTRACT

A first pair of transistors, Q721 and Q723, operating, each, as an emitter follower, has a relatively low emitter current. The emitter followers drive corresponding base electrodes of transistors of a second pair of transistors, Q148 and Q149, coupled as a differential amplifier. A current gain compensating transistor Q726 has a current gain that tracks current gain variations of each of the transistors of the second pair. A base electrode current of the compensating transistor and a second current $i_{Q727}$ that is unaffected by current gain variations are summed. The summed current is coupled via transistors Q722 and Q724 of a current mirror arrangement to first and second junction terminals, 610e and 610f. The junction terminals are coupled between the respective emitter electrodes of the emitter followers and the base electrodes of the second pair. Currents generated by the current mirror arrangement compensate for variations in the base currents in the transistors of the second pair so as to maintain the emitter currents in the emitter followers substantially unaffected by these variations.

13 Claims, 2 Drawing Sheets

CURRENT GAIN COMPENSATION ARRANGEMENT

The invention relates to an amplifier stage in which a transistor current gain compensation is provided.

In a power supply arrangement of, for example, a television receiver, a voltage representative of a DC, regulated supply voltage B+ is coupled to, for example, an inverting input terminal of an input stage of an amplifier that is included in a voltage regulator that regulates voltage B+. A reference voltage is coupled to, for example, a noninverting input terminal of the amplifier. The feed-back voltage that is, for example, representative, of regulated supply voltage B+ is compared in the amplifier with the reference voltage to generate an output voltage that is applied to a controllable arrangement via other stages of the regulator. The controllable arrangement establishes voltage B+ at a level that is determined by the reference voltage. Voltage B+ may be used, for example, to energize a deflection circuit output stage of a cathode ray tube (CRT). The voltage regulator that includes the input stage may be contained in an integrated circuit (IC).

It may be desirable to have a low collector current in, for example, a transistor of the amplifier so as to minimize the input current in each of the inverting and noninverting terminals of the amplifier. Low input current is advantageous in that it reduces offset voltage variations caused by corresponding input current variations. Low offset voltage variations advantageously provide better output voltage regulation. Also, having low input current results in having high input impedance for obtaining, advantageously, a higher open loop gain of the amplifier than if the input impedance were lower. High open loop gain also improves the voltage regulation. Low input current may be obtained, for example, by maintaining low an emitter current in the transistor. As an additional advantage, low emitter current results in lower power dissipation in the IC.

A circuit, embodying an aspect of the invention, includes a first pair of transistors each operating as an emitter follower having a low emitter current. The base electrodes of the transistors form corresponding inverting and noninverting input terminals of an amplifier. A second pair of transistors of the P-N-P type, for example, coupled in a differential amplifier configuration, have base electrodes that are coupled to the corresponding emitter electrodes of the first pair. The corresponding base electrodes of the second pair are differentially driven by the emitter followers. A current gain compensating transistor has a current gain that tracks current gain variations of one of the transistors of the second pair. A base electrode current of the compensating transistor is coupled via collector electrodes of corresponding transistors of a third pair of transistors that are included in a current mirror arrangement to corresponding pair of junction terminals. Each one of the junction terminals is coupled between the emitter electrode of the corresponding transistor of the first pair and the base electrode of the corresponding transistor of the second pair. Because a P-N-P transistor has a relatively low current gain, the low emitter currents in the first pair are comparable in value to the base currents in the second pair.

Temperature and tolerances variations or deviations may cause the base currents of each of the transistors of the second pair to change or deviate from its respective nominal value. The deviations occur as a result of corresponding change or deviation of a current gain characteristic of each of the transistors of the second pair. The current gain in each transistor is defined as the ratio between the DC collector current and the DC base current. If left uncompensated, such base current deviation in the transistors of the second pair may, disadvantageously, cause the corresponding emitter currents in each of the emitter followers to deviate significantly from their corresponding nominal values. This is so because the emitter current in each of the emitter followers is equal to the difference between the collector current of the corresponding transistor of the third pair and the base current of the corresponding transistor of the second pair. Since the emitter current of each of the emitter followers is small and comparable in value to the base current of the transistor of the second pair, deviations of the current gain characteristics may adversely affect the offset voltage between the input terminals of the amplifier and also may change the signal gain of the amplifier.

In accordance with a feature of the invention, variation of the base current of the current gain compensating transistor compensates for the corresponding variations in the base currents in the transistors of the second pair that maintains the emitter currents in the emitter followers substantially unaffected.

FIG. 1 illustrates a simplified schematic diagram of a power supply of a television receiver, not shown in the FIGURES, that includes a regulator 100 that is an integrated circuit that regulates a supply voltage B+. Voltage B+ may be used, for example to energize a horizontal deflection circuit or output stage 99 of the television receiver.

Figure 1:
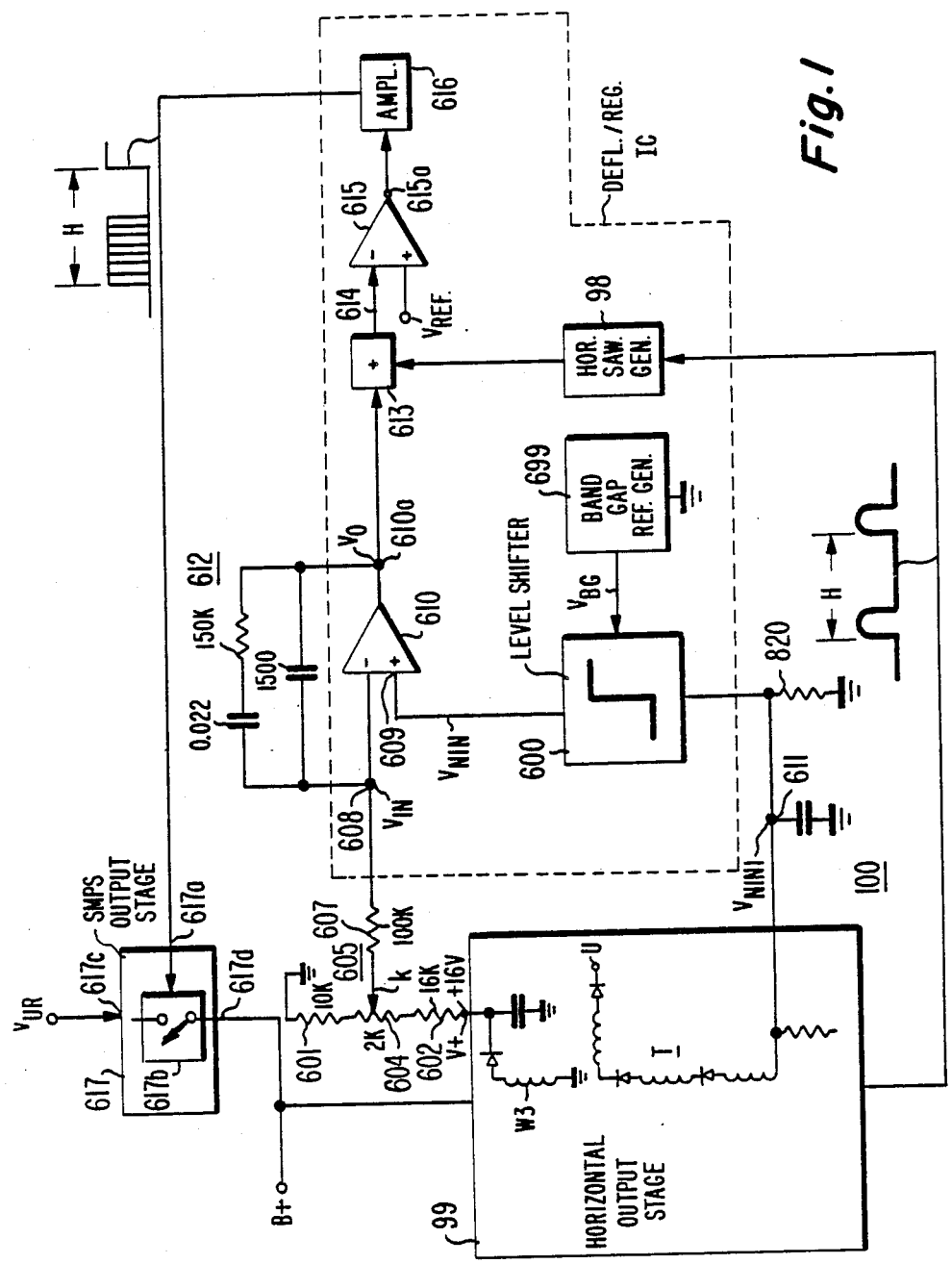
FIG. 1 illustrates a simplified schematic diagram of a power supply regulator circuit that includes a current gain or compensation arrangement, embodying an aspect of the invention.

A voltage V+, representative of voltage B+, is obtained by rectifying a retrace voltage that is developed across a winding W3 of a flyback transformer T of output stage 99. Voltage V+ is coupled to a voltage divider 605 that includes series coupled resistors 601, 604 and 602. Resistor 604 includes a wiper k for developing at wiper k a voltage that is representative of, for example, voltage B+. The voltage at wiper k, that is adjustable by varying the position of wiper k, is coupled to an inverting input terminal 608 of an error amplifier 610 via a resistor 607.

A small voltage that is proportional to the beam current in the CRT of the receiver, that is not shown in the FIGURES, is coupled from a tertiary winding of transformer T to a terminal 611 to form a voltage $V_{NIN1}$ that is indicative of the beam current representative voltage.

Voltage $V_{NIN1}$ that varies when a variation of the beam current occurs, is coupled via a level shifter 600 to a noninverting input terminal 609 of error amplifier 610 to produce an input voltage $V_{NIN}$. Level shifter 600 establishes a fixed offset voltage between terminals 611 and 608 that is determined by a voltage $V_{BG}$. Voltage $V_{BG}$ is generated in a bandgap type voltage source 699. Bandgap type voltage source 699, advantageously, maintains voltage $V_{BG}$ constant when a temperature change occurs such that voltage $V_{BG}$ is affected significantly less by components aging or tolerances than would have occurred had a zener diode been used. As explained later on, in operation the feedback arrangement of regulator 100 causes voltage B+ to be such that voltage $V_{IN}$ becomes equal to voltage $V_{NIN}$.

An integrating filter 612 is coupled between inverting input terminal 608 and an output terminal 610a of amplifier 610 to provide the loop filter of regulator 100. A filtered, error voltage $V_O$, developed at terminal 610a, is coupled to a first input terminal of an adder 613. A horizontal sawtooth generator 98 develops a horizontal rate signal, having an upramping portion, is added to error voltage $V_O$ in adder 613. The sum signal, a signal 614, that is also upramping, is applied to an inverting input terminal of a comparator 615 functioning as a pulse width modulator.

When, during its upramping portion, signal 614 becomes more positive than a constant DC voltage $V_{REF}$, that is coupled to a noninverting input terminal of comparator 615, a negative going transition at an output terminal 615a of comparator 615 is coupled via a buffer amplifier 616 to a control terminal 617a of a switch 617b of a switch mode power supply output stage 617 to turn on switch 617b of output stage 617.

An input terminal 617c of output stage 617 is coupled to unregulated voltage $V_{UR}$. Regulated voltage B+ is developed at an output terminal 617d of output stage 617.

The duration, during each horizontal period, H, in which switch 617b conducts is determined by the level of error voltage $V_O$ of error amplifier 610. Thus, regulated voltage B+ is determined by voltage $V_{NIN}$. As indicated before, voltage is produced by level shifter 600, that is described now in detail.

Figure 2:
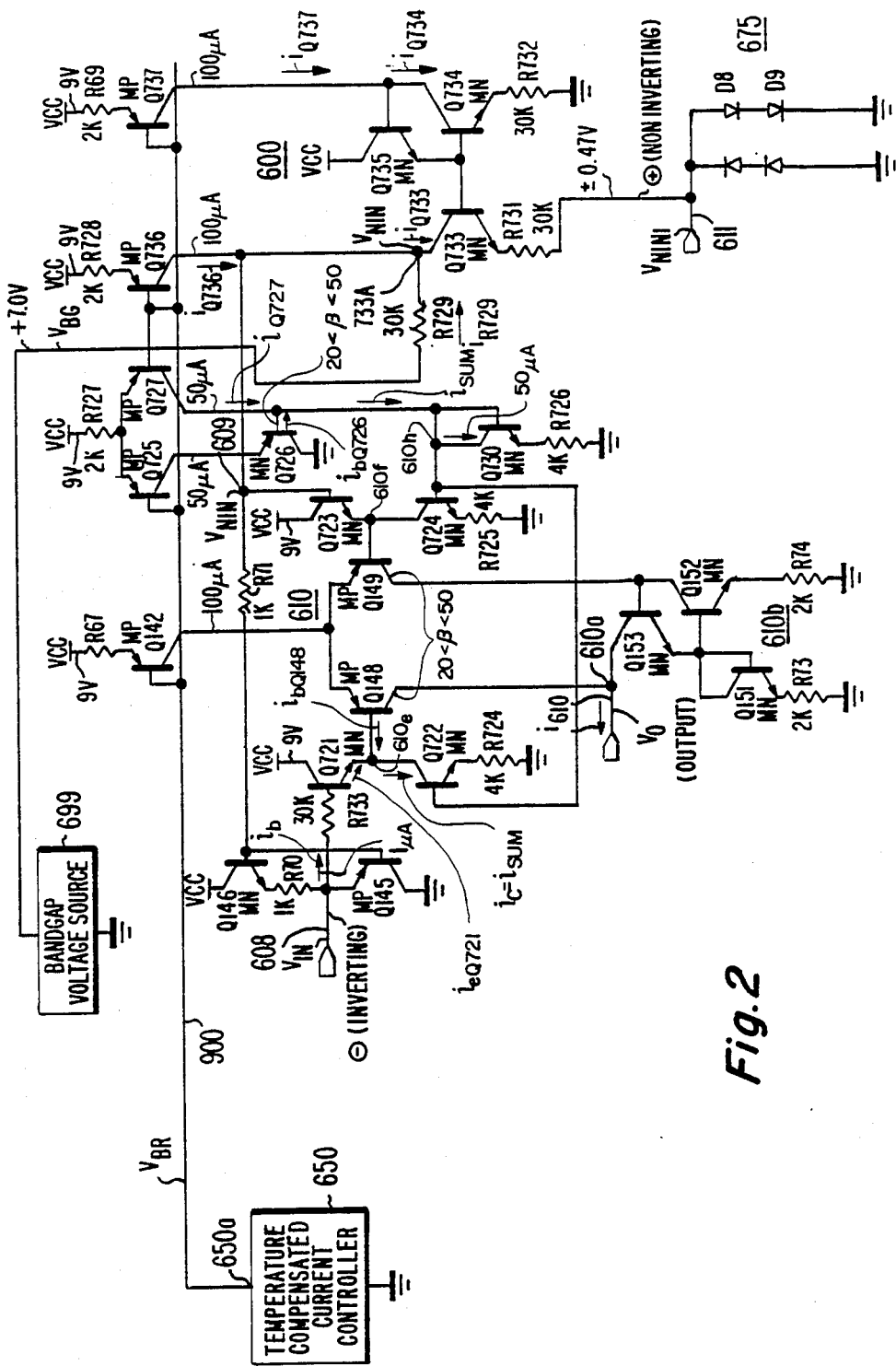
FIG. 2 illustrates a detailed schematic diagram of the current gain compensation arrangement of FIG. 1.

FIG. 2 illustrates a schematic diagram of error amplifier 610 of FIG. 1, embodying an aspect of the invention and of level shifter 600. Similar numbers in FIGS. 1 and 2 represent similar items or functions.

Level shifter 600 of FIG. 2 is temperature compensated over a wide range of ambient operating temperatures, such as between 0° C. and 70° C., to produce voltage $V_{NIN}$ that is substantially unaffected by a change in the temperature within such range.

A temperature compensated current control arrangement 650 generates a control voltage $V_{BR}$ on a rail or signal line 900. Signal line 900 is coupled to the base electrode of each of transistors Q142, Q725, Q727, Q736 and Q737. The emitter electrodes of the above-mentioned transistors are coupled through corresponding resistors to a fixed DC voltage $V_{cc}$. Current control arrangement 650 controls voltage $V_{BR}$ in such a way that the collector current in each of the above-mentioned transistors stays substantially constant when the temperature changes and is substantially unaffected by the current gain of the corresponding transistor. An example of an arrangement that is similar to current control arrangement 650 is described in detail in U.S. Pat. No. 3,886,435, in the name of S. A. Steckler, entitled VBE VOLTAGE SOURCE TEMPERATURE COMPENSATION NETWORK that is incorporated by reference herein.

Level shifter 600 includes transistors Q736 and Q737. The emitter currents in transistors Q736 and Q737 are controlled by resistors R728 and R69, respectively, having the same values that cause the respective collector currents of transistors Q736 and Q737 that are temperature compensated to be equal. The collector of transistor Q737 is coupled to a current mirror arrangement that includes transistors Q733, Q734 and Q735. The collector transistor Q737 is coupled to the collector of transistor Q734. The emitter of transistor Q735 is coupled to each of the bases of transistors Q733 and Q734, respectively. Transistor Q735 provides the base current drive to each of transistors Q733 and Q734. The emitter of transistor Q734 is coupled to ground via a resistor R732. The P-N junction of transistor Q734, between the base and emitter electrodes of transistor Q734, provides temperature compensation that compensates for a temperature related variation of the base-emitter voltage of transistors Q733. The emitter of transistor Q733 is coupled to resistor R731 which is coupled to terminal 611, where voltage $V_{NIN1}$ of FIG. 1 is developed, via a resistor R731 that is equal to resistor R732. Voltage $V_{NIN1}$ is prevented from exceeding predetermined limits in either polarity by a diode network 675. The collector of transistor Q733 is coupled to the collector of transistor Q736 at a junction terminal 733A.

Assume that voltage $V_{NIN1}$ is zero. In this case, the current mirror arrangement of transistors Q733, Q734 and Q735, produces a collector current $i_{Q733}$ in transistor Q733 that is equal to a collector current $i_{Q734}$ in transistor Q734 because the base current of transistor Q735 is negligible. As explained before, when voltage $V_{NIN1}$ is zero, collector current $i_{Q736}$ in transistor Q736 is equal to collector current $i_{Q737}$ in transistor Q737 over a wide temperature range. Also, when voltage $V_{NIN1}$ is zero, each of collector current $i_{Q733}$ that is the current mirror of current $i_{Q734}$ is equal to current $i_{Q737}$ over such wide temperature range. It follows that current $i_{Q733}$ is also equal to current $i_{Q736}$.

Bandgap voltage source 699 supplies temperature compensated reference voltage $V_{BG}$ that is coupled via a resistor R729 to terminal 733A. Because, as described before, when voltage $V_{NIN1}$ is zero, current $i_{Q733}$ is supplied entirely by current $i_{Q736}$, and because the impedance at terminal 733A, that is contributed by the collectors of transistors Q733 and Q736 is high, a current $i_{R729}$ in resistor R729 is zero; therefore, voltage $V_{NIN}$ at terminal 733A is equal to voltage $V_{BG}$. Thus, voltage $V_{NIN}$ is level shifted by an amount that is equal to voltage $V_{BG}$.

When voltage $V_{NIN1}$ at terminal 611 of FIG. 1 is different from zero, current $i_{Q736}$ and $i_{Q737}$ will not be equal. The difference current between currents $i_{Q733}$ and $i_{Q736}$ will cause a voltage to develop across resistor R729 that, in turn, will cause a corresponding change in voltage $V_{NIN}$ at terminal 733A of FIG. 1. Because transistor Q733 of FIG. 2 is coupled, relative to voltage $V_{NIN1}$, as a common base amplifier, and because resistors R731 and R729 are, illustratively, equal, the gain, or the ratio between voltage $V_{NIN}$ and voltage $V_{NIN1}$, is one, resulting in an amplifier having a unity gain.

Voltage $V_{NIN}$, that is level shifted relative to voltage $V_{NIN1}$ by amount that is equal to voltage $V_{BG}$, follows variations of voltage $V_{NIN1}$ that occur in a range between positive and negative values.

Voltage $V_{BG}$ is temperature compensated and has a tolerance range that is narrow relative to, for example, a zener diode. Furthermore, component aging affects voltage $V_{BG}$ substantially less than it affects, for example, the breakdown voltage of a zener diode. Moreover, the level shifting caused by level shifter 600 is, advantageously, less susceptible to temperature, aging and noise when compared with that produced by a corresponding level shifter in the prior art that utilizes a zener diode interposed between a beam current input terminal and a noninverting input terminal of a differential amplifier to perform such level shifting.

Should a temperature change cause a corresponding change in current $i_{Q736}$, for example, that, as indicated before, would be relatively small, transistors Q737, Q733, Q734 and Q735 will cause a proportional change in current $i_{Q733}$ to occur that will prevent even such small change in temperature from affecting the difference current between currents $i_{Q736}$ and $i_{Q733}$. Therefore, when voltage $V_{NIN1}$ is zero, voltage $V_{NIN}$ is, advantageously, not affected by collector currents $i_{Q736}$ and $i_{Q737}$, but is entirely determined by voltage $V_{BG}$ that is temperature compensated.

It should be understood that temperature compensation may be adequate even when voltage $V_{NIN1}$ is significantly different from zero. If temperature compensation, in this case, is inadequate, a further improvement in temperature compensation may be obtained by coupling the terminal of, for example, resistor R732, that, in FIG. 2 is grounded, to a voltage that is different from zero and that is related to, for example, voltage $V_{NIN1}$.

Advantageously, voltage $V_{BG}$, as explained before, is maintained at tight tolerances, is temperature compensated and is substantially unaffected by components aging. Therefore, advantageously, no factory temperature burn-in process is required prior to the installment of regulator 100 of FIG. 1 in the television receiver. Furthermore, voltage divider 605 that includes resistors 601, 604 and 602, advantageously, is required to compensate only for a narrower tolerance range.

Voltage $V_{IN}$ is coupled to the base of a transistors Q721 of error amplifier 610 of FIG. 2. The clamping operation of a pair of transistors Q145 and Q146 prevents voltage $V_{IN}$ from being above voltage $V_{BG}$ or from being below voltage $V_{BG}$ by more than a predetermined magnitude. Voltage $V_{IN}$ is coupled to inverting input terminal 608 and voltage $V_{NIN}$ is coupled to noninverting input terminal 609 of error amplifier 610, embodying an aspect of the invention. Amplifier 610 includes a current source formed by a transistor Q142 that provides the combined emitter currents of a transistor Q148 and of a transistor Q149, coupled as a differential amplifier. The bases of transistors Q148 and Q149 are coupled to the emitters of transistors Q721 and Q723, respectively. Transistors Q721 and Q723 operate as emitter followers for coupling voltages $V_{IN}$ and $V_{NIN}$ to the bases of transistors Q148 and Q149, respectively.

A transistor Q722 has a collector electrode that is coupled to a terminal 610e, between the base and emitter electrodes of transistors Q148 and Q721, respectively. A collector current $i_c$ of transistor Q722 is equal to a sum of a base current $i_{bQ148}$ of transistor Q148 and of an emitter current $i_e$ of transistor Q721 for supplying both the base current and the emitter current, respectively. The base electrode of transistor Q722 is coupled to a terminal 610h for varying collector current $i_c$ in a manner that compensates for current gain changes in transistor Q148, as described later on. A collector electrode of a transistor Q730, coupled as a diode, that forms with transistor Q722 a current mirror arrangement, is also coupled to a terminal 610h. Transistor Q727, having a base electrode that is coupled to voltage $V_{BR}$ generates a temperature compensated collector current that is unaffected by current gain variation of transistor Q727, as indicated before. A current $i_{Q727}$ is coupled also to terminal 610h such that collector current $i_{Q727}$ in transistor Q727 provides a first portion of the collector current of transistor Q730.

In accordance with a feature of the invention, the first portion is independent of current gain variations or deviations of transistor Q727. A second portion of the collector current of transistor Q730 is provided by a base current $i_{bQ726}$ of a transistor Q726 that is summed with current $i_{Q727}$ to form a sum current $i_{sum}$ that is coupled to terminal 610h. The second portion that provides current gain compensation is dependent on the current gain of transistor Q726.

The current gain of transistor Q726 follows or tracks in the same sense changes or variations of the current gain of transistor Q148, occurring due to, for example, temperature or tolerances. This is accomplished, for example, by constructing the two P-N-P transistors with the same geometry using a similar process and by maintaining the operating temperature of the two transistors the same.

In steady state operation of the differential amplifier, the emitter current in each of transistors Q148 and Q726 is substantially the same. The nominal emitter currents in transistors Q148 and Q726 are, each, for example, 50 microamperes, as controlled via transistors Q142 and Q725, respectively. As explained before, the collector currents in transistors Q142 and Q725 that are controlled by voltage $V_{BR}$ are temperature compensated. A deviation in base current $i_{bQ148}$ will be accompanied with the same sense deviation in base current $i_{bQ726}$ of transistor Q726 and, therefore, also in the collector current of transistor Q730. Because of current mirror operation formed by the arrangement that includes transistors Q722 and Q730, a change in base current $i_{bQ726}$ of transistor Q726 will cause substantially the same sense change in the collector current of each of transistors Q730 and Q722.

Therefore, in accordance with another feature of the invention, the change in base current $i_{bQ148}$ of transistor Q148 will be, advantageously, compensated by the corresponding equal change of the collector current of transistor Q722. The change in the collector current of transistor Q722 is in the same sense so as to prevent the emitter current of transistor Q721 from changing or deviating from its nominal value when base current $i_{bQ148}$ of transistor Q148 changes. The emitter current of transistor Q721 will be determined by collector current $i_{Q727}$. Current $i_{Q727}$ is independent of current gain variations, as explained before.

In accordance with an aspect of the invention, transistor Q722 that is included in the current mirror arrangement generates both a first current portion and a second current portion. The first current portion maintains the emitter current of transistor Q721, advantageously, independent of the current gain of transistor Q148 and the second current portion supplies the base current of transistor Q148. It should be understood that since transistors Q722, Q724 and Q730 are of the N-P-N type, having a high current gain, their base currents may be ignored in this analysis.

Similarly, a change in the base current of transistor Q149 will be compensated by a corresponding change in a collector current of a transistor Q724. The collector current of transistor Q724 is controlled in the same manner as that of transistor Q722.

The emitter currents of each of transistors Q721 and Q723 are, each, for example, not significantly larger than each of the base currents of transistors Q148 and Q149, respectively. The emitter currents in transistors Q721 and Q723 are, advantageously, maintained substantially unaffected by variation or change of the current gain of transistors Q148 and Q149. As explained before, such changes and variations may occur due to temperature or tolerances. Therefore, advantageously, the offset voltage of amplifier 610 is less affected by current gain changes of transistors Q148 and Q149. It follows that voltage regulation tolerances in the power supply are improved. Additionally, the current gain compensation will, advantageously, prevent even an excessive current $i_{bQ148}$, for example, from cutting off transistor Q721.

In accordance with another aspect of the invention, deviations of the current gain characteristic of transistors Q148 and Q149 are sensed in transistor Q726 that is coupled outside the signal path in the differential amplifier. Transistor Q726 is also couple outside the current paths in each of transistors Q148 and Q149 that form the differential amplifier.

A current mirror arrangement 610b that is coupled to the collectors of transistors Q148 and Q149 that forms the differential amplifier causes a current $i_{610}$, coupled to integrating filter 612 of FIG. 1, to be equal to the difference between the collector currents in transistors Q148 and Q153. Consequently, current i that is coupled to filter 612 of FIG. 1, is proportional to the difference between voltages $V_{IN}$ and $V_{NIN}$. The proportionality factor is determined by the gain of error amplifier 610 that is determined by transistors Q148 and Q149.

What is claimed is:

1. An amplifier, comprising:
   first and second transistors that are coupled to form a differential amplifier;
   an input stage coupled at a first junction terminal to a control electrode of said second transistor for establishing a voltage level at said control electrode of said second transistor in accordance with a voltage that is developed at an input terminal of said input stage such that an output current flowing in said input stage is coupled to said first junction terminal;
   a source of a first current;
   a third transistor having a current gain characteristic that is representative of a current gain characteristic of said second transistor for generating a control electrode current of said third transistor that is combined with said first current to produce a combined second current, said second current having a first portion derived from said first current and a second portion derived from said control electrode current of said third transistor; and
   a current mirror arrangement responsive to said second current for generating in said current mirror arrangement a third current that is coupled to said first junction terminal, said third current having a first portion derived from said first current of generating said output current of said input stage and a second portion derived from said control electrode current of said third transistor for generating a control electrode current of said second transistor, wherein a deviation of said current gain characteristic of said second transistor from a nominal value thereof that produces a corresponding deviation in said control electrode current of said second transistor is compensated by said control electrode current of said third transistor so as to substantially prevent such current deviation from affecting said output current of said input stage.

2. An amplifier according to claim 1 wherein said input stage comprises a fourth transistor coupled as an emitter follower and said output current of said input stage flows in an emitter electrode of said fourth transistor.

3. An amplifier according to claim 1 wherein said first current generating means generates said first current having a value that is independent of said variation in said current gain characteristic of at least one of said second and third transistors.

4. An amplifier according to claim 1 wherein said current mirror arrangement prevents said deviation in said current gain characteristic of said second transistor from affecting an offset voltage at said input terminal of said input stage.

5. An amplifier according to claim 1 further comprising, second means coupled to a second junction terminal between corresponding main current conducting electrodes of said first and second transistors for generating a current that varies in the same sense as said first current independently of said current gain characteristic of said second transistor.

6. An amplifier according to claim 1 wherein said first, second and third transistors are bipolar transistors of the same type.

7. An amplifier according to claim 1 wherein said current mirror arrangement includes a fourth transistor that generates said third current, said third current flowing in the same direction as said first current and being equal to the sum of said first current and said control electrode current of said third transistor.

8. An amplifier according to claim 1 wherein said third transistor is coupled outside a signal path formed between an input terminal and an output terminal of said amplifier.

9. An amplifier according to claim 1 further comprising means for generating a temperature compensated control voltage that is coupled to a control electrode of a bipolar, fourth transistor for generating said first current at a collector electrode of said fourth transistor that is unaffected by a variation of a current gain characteristic of said fourth transistor.

10. An amplifier according to claim 9 wherein said current mirror arrangement further comprises a fifth transistor coupled in a diode configuration for conducting therethrough a current that is equal to a sum of said first current and said control electrode current of said third transistor.

11. An amplifier according to claim 10 wherein said current mirror arrangement includes a sixth transistor having a base electrode that is coupled to said fifth transistor and a collector electrode that is coupled to said control electrode of said second transistor.

12. An amplifier according to claim 11 further comprising a seventh transistor having a base electrode that is coupled to said fifth transistor and a collector electrode that is coupled to a base electrode of said first transistor.

13. An amplifier according to claim 1 wherein said amplifier forms an error amplifier in a regulator of a television apparatus power supply.

* * * * *